(12) United States Patent  
Newby

(10) Patent No.: US 10,388,579 B2  
(45) Date of Patent: Aug. 20, 2019

(54) MULTI-PLATE SEMICONDUCTOR WAFER TESTING SYSTEMS

(71) Applicant: TEXAS INSTRUMENTS INCORPORATED, Dallas, TX (US)

(72) Inventor: Randal Leray Newby, Raymond, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 161 days.

(21) Appl. No.: 15/711,763

(22) Filed: Sep. 21, 2017

(65) Prior Publication Data

US 2019/0088560 A1  Mar. 21, 2019

(51) Int. Cl.
| | | |
|---|---|---|
| *H01L 21/66* | (2006.01) | |
| *G01R 1/073* | (2006.01) | |
| *G01R 31/28* | (2006.01) | |
| *G02B 6/12* | (2006.01) | |
| *G02B 6/36* | (2006.01) | |
| *G02B 6/122* | (2006.01) | |

(52) U.S. Cl.
CPC .......... *H01L 22/34* (2013.01); *G01R 1/07314* (2013.01); *G01R 31/2831* (2013.01); *G01R 31/2887* (2013.01); *G01R 31/2889* (2013.01); *G02B 6/12004* (2013.01); *G02B 6/1221* (2013.01); *G02B 6/3616* (2013.01)

(58) Field of Classification Search
CPC ............. G02B 6/1221; G02B 6/3616; G02B 6/12004; G01R 31/2887; G01R 31/7314; G01R 31/2831; G01R 31/2889
See application file for complete search history.

(56) References Cited

U.S. PATENT DOCUMENTS

| | | | | |
|---|---|---|---|---|
| 6,078,186 A | * | 6/2000 | Hembree | G01R 31/2886 324/750.19 |
| 6,246,245 B1 | * | 6/2001 | Akram | G01R 1/07378 324/756.03 |
| 6,556,032 B2 | * | 4/2003 | Uher | G01R 1/0491 324/750.05 |
| 9,915,698 B2 | * | 3/2018 | Yamada | G01R 31/2887 |
| 2001/0000650 A1 | * | 5/2001 | Akram | G01R 1/0483 324/750.25 |
| 2004/0227532 A1 | * | 11/2004 | Orsillo | G01R 3/00 324/750.22 |
| 2008/0018350 A1 | * | 1/2008 | Chao | G01R 1/07378 324/754.18 |

(Continued)

*Primary Examiner* — Tung X Nguyen  
*Assistant Examiner* — Dominic E Hawkins  
(74) *Attorney, Agent, or Firm* — Ronald O. Neerings; Charles A. Brill; Frank D. Cimino

(57) ABSTRACT

In some embodiments, a semiconductor wafer testing system comprises a first plate configured to couple to a probe head, the first plate including a first alignment feature, a biasing member, a stopper, and pins. The system also comprises a second plate configured to fasten to the first plate and including a second alignment feature configured to engage with the first alignment feature. The first and second alignment features are configured to align the pins with a test wafer positioned between the first and second plates. The biasing member and the stopper are configured to cooperate to regulate a pressure with which the test wafer contacts the pins when the second plate is fastened to the first plate.

20 Claims, 7 Drawing Sheets

(56) References Cited

U.S. PATENT DOCUMENTS

| | | | | |
|---|---|---|---|---|
| 2008/0030214 A1* | 2/2008 | Nguyen | ............ | G01R 1/06727 |
| | | | | 324/754.03 |
| 2009/0284277 A1* | 11/2009 | Yamada | ............ | G01R 31/2891 |
| | | | | 324/754.08 |
| 2013/0088250 A1* | 4/2013 | Seo | ............ | G01R 1/0466 |
| | | | | 324/754.11 |
| 2013/0093453 A1* | 4/2013 | Sakata | ............ | G01R 31/2887 |
| | | | | 324/756.03 |
| 2014/0306729 A1* | 10/2014 | Chen | ............ | G01R 1/07378 |
| | | | | 324/750.22 |
| 2015/0130489 A1* | 5/2015 | Yamada | ............ | G01R 31/2891 |
| | | | | 324/754.11 |
| 2015/0276849 A1* | 10/2015 | Kuczera | ............ | G01R 31/2891 |
| | | | | 324/754.08 |
| 2017/0122984 A1* | 5/2017 | Hsu | ............ | G01R 1/07371 |

* cited by examiner

MULTI-PLATE SEMICONDUCTOR WAFER TESTING SYSTEMS

BACKGROUND

A wafer is a thin slice of semiconductor material, such as crystalline silicon, used to fabricate integrated circuits ("ICs"). Numerous ICs may be formed on a single wafer, and these ICs are separated from each other by way of a wafer singulation (or "dicing") process. Prior to wafer singulation, the ICs on the wafer are tested as a quality control measure, with poorly performing ICs being identified for subsequent removal.

SUMMARY

In accordance with at least one embodiment of the invention, a semiconductor wafer testing system comprises a first plate configured to couple to a probe head, the first plate including a first alignment feature, a biasing member, a stopper, and pins. The system also comprises a second plate configured to fasten to the first plate and including a second alignment feature configured to engage with the first alignment feature. The first and second alignment features are configured to align the pins with a test wafer positioned between the first and second plates. The biasing member and the stopper are configured to cooperate to regulate a pressure with which the test wafer contacts the pins when the second plate is fastened to the first plate.

One or more of the foregoing embodiments may be modified using one or more of the following concepts, in any form and in any combination: wherein the second plate is configured to attach to the test wafer; wherein the pins include compressible pins; wherein the biasing member is positioned on the first plate such that the biasing member has an uncompressed height that is greater than a height of the stopper; wherein the second plate includes a thumb screw to fasten to the first plate; wherein the test wafer is rectangular; further comprising a testing computer to provide an electrical signal to the test wafer, to receive a response signal from the test wafer, and to indicate a defect in at least one component of the system based on the received response signal.

In some embodiments, a semiconductor test wafer alignment plate (TWAP) comprises first alignment features to engage with second alignment features on a semiconductor test wafer engagement plate (TWEP), multiple fastening features to couple the TWAP to the TWEP, multiple biasing members to resist a test wafer pressed toward the biasing members by the TWEP, multiple stoppers to resist the test wafer pressed toward the stopper by the TWEP, and multiple pins to contact integrated circuits on the wafer. The multiple pins are to provide electrical signals to and receive electrical signals from integrated circuits on the test wafer.

One or more of the foregoing embodiments may be modified using one or more of the following concepts, in any form and in any combination: wherein each of the multiple biasing members, when uncompressed, has a height that is greater than that of each of the multiple stoppers; wherein the multiple pins are arranged in a rectangular pattern on the TWAP; wherein the multiple fastening features comprise threaded orifices to receive thumb screws; wherein each of the first alignment features, each of the multiple fastening features, each of the multiple biasing members, and each of the multiple stoppers is located closer to a perimeter of the TWAP than each of the multiple pins.

In some embodiments, a method comprises providing a first plate having a first alignment feature, a first fastening feature, a biasing member, a stopper, and a plurality of pins. The method also comprises providing a second plate having a second alignment feature and a second fastening feature, positioning a test wafer between the first and second plates, engaging the first and second alignment features, and fastening the second plate to the first plate using the first and second fastening features. The fastening comprises pushing the test wafer against the biasing member such that the test wafer contacts the stopper and the plurality of pins.

One or more of the foregoing embodiments may be modified using one or more of the following concepts, in any form and in any combination: wherein the first and second plates are part of a semiconductor wafer testing system, and further comprising testing the test wafer using the first and second plates, debugging the semiconductor wafer testing system based on results of the test wafer testing, removing the first and second plates from the semiconductor wafer testing system, testing a production wafer using the semiconductor wafer testing system, and singulating the production wafer to produce a plurality of dies; further comprising packaging at least one of the plurality of dies based at least in part on results of the production wafer testing; wherein the test wafer comprises an integrated circuit, and wherein the fastening includes urging the integrated circuit to contact the plurality of pins; further comprising attaching the test wafer to the second plate prior to fastening the second plate to the first plate; wherein the first fastening feature includes a threaded orifice and wherein the second fastening feature includes a thumb screw; further comprising: applying electrical signals to the test wafer via the plurality of pins, receiving one or more signals from the test wafer in response to the application, determining that a defect is present in at least one of the plurality of pins in response to the receipt, and accessing the defective at least one of the plurality of pins to correct the defect; further comprising identifying a defect in at least one of the plurality of pins using the test wafer and without using a wafer probe cell.

BRIEF DESCRIPTION OF THE DRAWINGS

For a detailed description of various examples, reference will now be made to the accompanying drawings in which.

DETAILED DESCRIPTION

Figure 1:
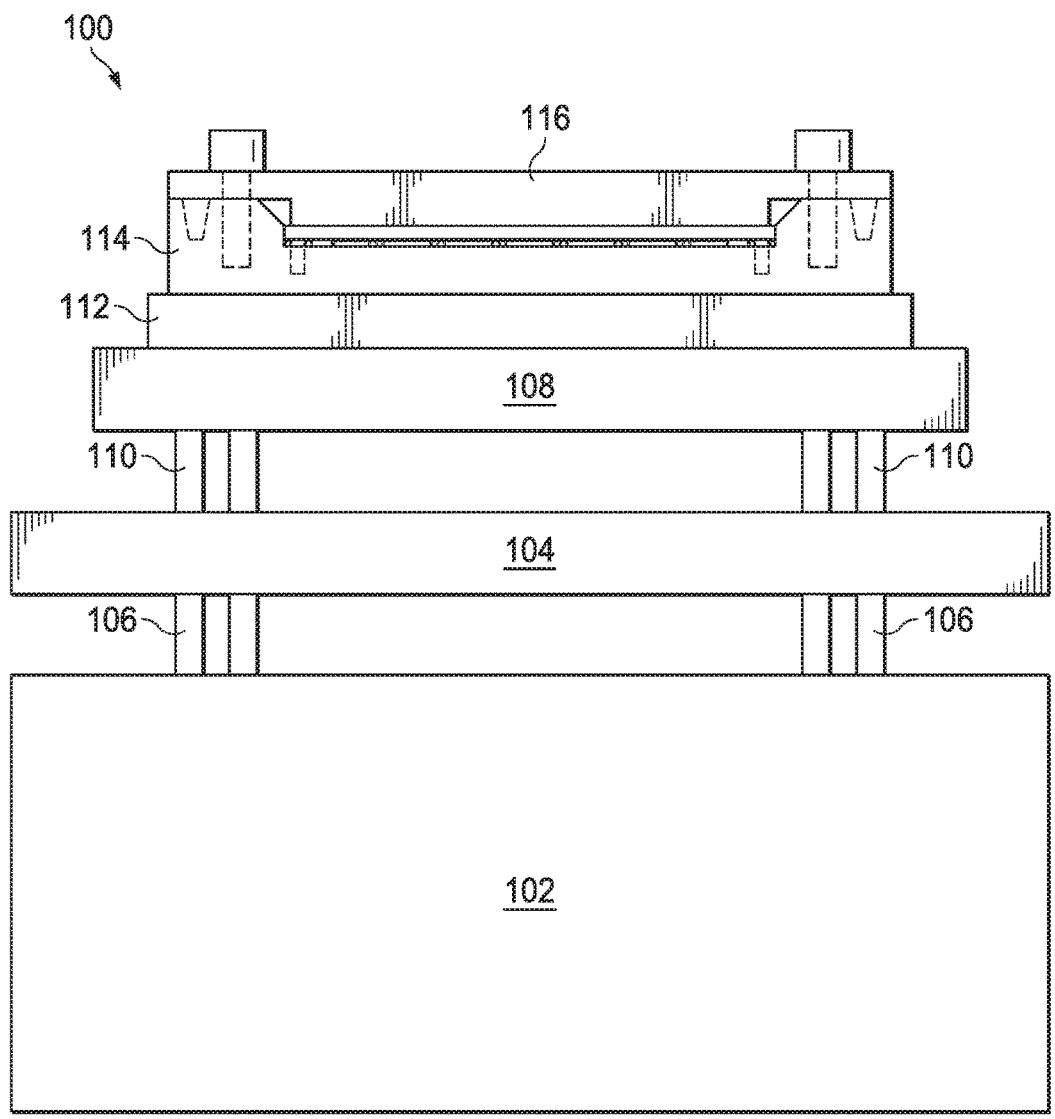
FIG. 1 is a side view of an illustrative semiconductor wafer testing system, in accordance with various embodiments.

Typically, wafer IC testing is performed using wafer probe cells. A wafer probe cell is a large enclosure, often measuring 250 cubic feet or more, that houses various components of a wafer testing system. Such components may include, for example, testers, test heads, probe interface boards, pogo towers, probe cards, probe heads, and wafer probers. Many of these components, including the pins that connect the components to each other, are susceptible to failure, damage, and—in the case of pins—inadvertent misalignment. The presence of a defective component can be determined by placing a test wafer with known electrical characteristics on the wafer prober and allowing the wafer probe cell to test operation of the test wafer. Irregularities in the test results relative to the test results that would be expected for the test wafer used may indicate a problem with one or more components of the wafer probe cell, such as a pin. However, identifying the specific defective component in the wafer probe cell is difficult at least because of the design of the wafer probe cell, which encloses the components of the testing system in an inaccessible manner.

Embodiments disclosed herein are directed to a wafer testing system (and attendant methods) for testing wafer ICs that resolves the foregoing problems. The disclosed wafer testing system includes a pair of mating plates. These mating plates, which are described in detail below, are configured to receive a sectioned test wafer (i.e., a diced portion of a wafer and operate in lieu of a traditional wafer prober). Because a traditional wafer prober is not used during debugging of the disclosed wafer testing system, the system is not enclosed in the same manner as it would be in a traditional wafer probe cell. Thus, the various components of the disclosed wafer testing system are physically accessible and are easier to debug when the testing of a sectioned test wafer indicates that one or more of the components is defective.

Embodiments of a wafer testing system providing these technical advantages may include a test wafer alignment plate ("TWAP"). The TWAP includes multiple biasing members, multiple stoppers, and a plurality of pins (e.g., pogo pins), all of which receive a portion of a test wafer that has been sectioned (or "diced") to a predetermined size. The embodiments further include a test wafer engagement plate ("TWEP") that fastens to the TWAP using fasteners (e.g., thumb screws). The sectioned test wafer is positioned between these two plates, with the surface of the test wafer on which ICs are formed facing the TWAP so that the pins make contact with the ICs. The TWAP and TWEP comprise mating alignment features that enable the precise alignment of the pins and corresponding contact points on the test wafer ICs.

When the alignment features on the TWAP and TWEP are mated and the fasteners on the TWEP are tightened, the TWEP pushes the test wafer toward the TWAP, thus compressing the biasing members and the pins. Continued tightening of the fasteners increases biasing member and pin compression until the test wafer makes contact with the stoppers, at which point further tightening of the fasteners causes no additional compression of the biasing members or pins and no additional movement of the test wafer. In this way, the alignment features facilitate precise alignment of the test wafer and the pins, while the fasteners, biasing members, and stoppers facilitate the application of a specific contact pressure between the test wafer and the pins. Because the test wafer is only a sectioned portion of an entire wafer and is diced to a predetermined size for mounting as described above, proper test wafer testing can be accomplished without the use of a traditional wafer probe cell that tests a full-size wafer using a wafer prober. This, in turn, provides easy and direct access to the various potential failure points in the wafer testing system to diagnose pin problems. After the wafer testing system has been debugged and proper operation has been verified, the mating plates may be removed from the system and replaced with a wafer prober to facilitate the testing of production wafers on a mass scale. At least some of these embodiments are now described in greater detail with respect to the drawings.

FIG. 1 is a side view of an illustrative semiconductor wafer testing system 100. The system 100 may be used to identify the presence of defects in one or more components of the system 100 by testing test wafers having known electrical characteristics. Irregularities in the test results indicate the presence of defects in the system 100—for example, in one or more pins connecting the various components of the system 100 to each other. Because the system 100 is not a traditional wafer probe cell and lacks the enclosed structure of a typical wafer probe cell, the defective component(s) may be physically accessed and thus readily identified (e.g., by reading electrical signals on a probe card).

In some embodiments, the illustrative system 100 comprises a test head 102 that couples to a probe interface board 104 via pins 106. The pins 106 may be compressible (e.g., pogo) pins or any other suitable type of pins, as is the case with all pins described in this disclosure. (The pins in FIG. 1 are enlarged for clarity and ease of explanation; in practice, the pins may be smaller than depicted in FIG. 1.) The probe interface board 104, in turn, couples to a probe card 108 via pins 110. A probe head 112 is mounted directly on the probe card 108, and a semiconductor test wafer alignment plate (TWAP) 114 is mounted directly on the probe head 112. As described in greater detail below, a semiconductor test wafer engagement plate (TWEP) 116 may be fastened to and unfastened from the TWAP 114. A sectioned test wafer (not expressly depicted in FIG. 1) to be tested by the system 100 may be positioned between the TWAP 114 and the TWEP 116. As the TWAP 114 is fastened to the TWEP 116, the ICs formed on the test wafer make contact with pins positioned on the surface of the TWAP 114. The alignment of the ICs with the pins and the pressure with which the ICs contact the pins are controlled by multiple physical features of the TWAP 114 and TWEP 116, as described below. Once the TWAP 114, TWEP 116, and test wafer are properly aligned and in appropriate physical contact, the pins on the TWAP 114 are used to test the test wafer. As explained, the electrical characteristics of the test wafer are known such that irregularities in test results indicate defects in one or more components of the system 100. The non-enclosed physical structure of the system 100, which is made possible by the replacement of the traditional wafer prober by the TWAP 114 and TWEP 116, facilitates the easy debugging of the system 100.

Figure 2A:
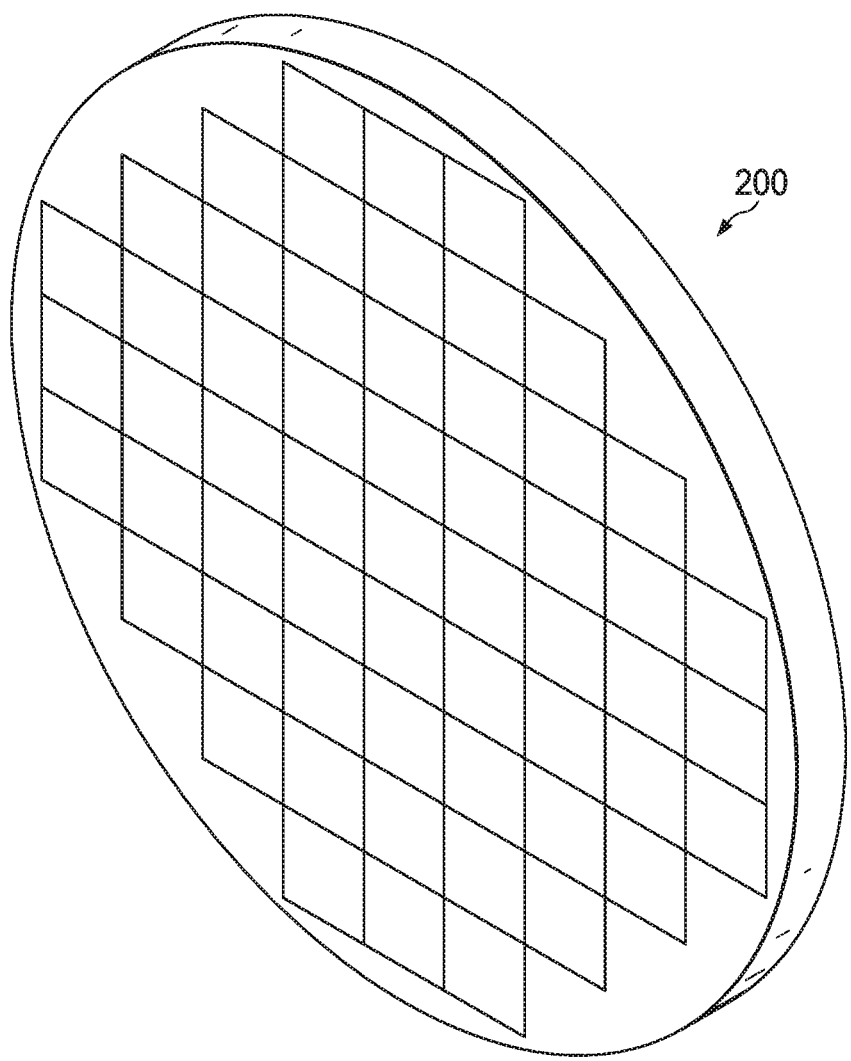
FIG. 2A is a perspective view of an illustrative wafer prior to sawing, in accordance with various embodiments.
Figure 2B:
FIG. 2B is a top-down view of an illustrative test wafer post-sawing, in accordance with various embodiments.

FIG. 2A is a perspective view of an illustrative wafer 200 prior to a sectioning process that produces a test wafer, in accordance with various embodiments. The wafer 200 may comprise any suitable material, such as silicon or gallium arsenide, and it may further comprise any number of ICs. The wafer 200 is sectioned using any suitable process, such as sawing, to produce the sectioned test wafer 300 depicted in the top-down view of FIG. 2B. The sectioned test wafer 300 (which, in some embodiments, is approximately 770 micrometers (um) thick) may be tested one or more times in a properly-functioning wafer testing apparatus or system other than the system 100 of FIG. 1 to determine the electrical characteristics of the test wafer 300. In this way, the response of the test wafer 300 to testing is known, and the test results obtained when the wafer testing system 100 tests the test wafer 300 may be compared to the expected test results to detect the presence of potential defects in one or more components of the system 100. In at least some embodiments, the physical dimensions of the test wafer 300 are determined based on the dimensions of the plates 114 and 116 depicted in FIG. 1. Specifically, the test wafer 300 may be dimensioned to minimize or eliminate lateral movement of the test wafer 300 as the plates 114, 116 are fastened together.

Figure 3A:
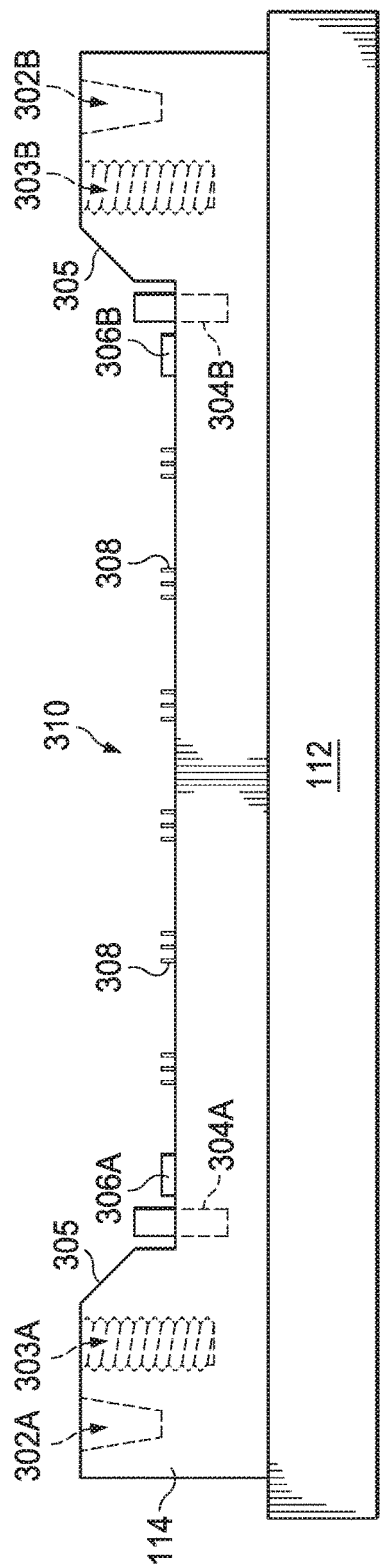
FIG. 3A is a side view of an illustrative semiconductor test wafer alignment plate mounted on a probe head, in accordance with various embodiments.

FIG. 3A is a side view of an illustrative semiconductor test wafer alignment plate (TWAP) 114 mounted on an illustrative probe head 112, in accordance with various embodiments. In at least some embodiments, the TWAP 114 comprises multiple alignment features 302A, 302B; multiple fastening features 303A, 303B; multiple biasing members 304A, 304B; multiple stoppers 306A, 306B; and multiple compressible pins 308 (e.g., pogo pins). Although FIG. 3A depicts two of each of the alignment features, fastening features, biasing members, and stoppers, any suitable number (e.g., one or more) of each of these features may be used.

The TWAP 114 may be fastened to the probe head 112 using any suitable technique, although in at least some embodiments, the TWAP 114 removably couples to the probe head 112 using, e.g., screws. The alignment features 302A, 302B may comprise any physical features that facilitate the precise alignment of the plates 114, 116 such that the pins 308 align with their respective ICs on a test wafer 300 (depicted in FIG. 3C and described below) facing the pins 308. In some embodiments, the alignment features 302A, 302B comprise cavities. In some embodiments, and as shown in FIG. 3A, such cavities are tapered such that the apertures of the cavities have a greater area than the bottoms of the cavities. In some embodiments, the cavities do not taper, such that the cavities form either cylinders or rectangular prisms. In some embodiments, the alignment features 302A, 302B comprise protrusions, and in some embodiments, such protrusions are tapered such that the tops of the protrusions have a smaller area than the bottoms of the protrusions. In some embodiments, the alignment features 302A, 302B comprise screws or threaded orifices to receive screws. Other types of alignment features 302A, 302B are contemplated. The fastening features 303A, 303B facilitate the fastening of the plate 116 to the TWAP 114, as described below with reference to FIGS. 3B and 3C. In at least some embodiments, the fastening features 303A, 303B are threaded orifices that receive screws, such as thumb screws. In some embodiments, the biasing members 304A, 304B, the stoppers 306A, 306B, and the pins 308 are positioned in a recessed area 310 on a surface of the TWAP 114 that is coincident with a plane that is lower in height than a plane with which the apertures of the fastening features 303A, 303B are coincident, as FIG. 3A depicts. In addition, in some embodiments, sloping (e.g., 45 degree) surfaces 305 may be positioned between the two aforementioned planes, as FIG. 3A depicts.

In at least some embodiments, the biasing members 304A, 304B comprise compression springs. The spring constant may be chosen as desired. Other types of biasing members, such as rubber, may be used instead of springs. The stoppers 306A, 306B are fixed structures that may be hollow or solid, may be of any suitable shape (e.g., cylinder, rectangular prism, cube), and may be composed of any suitable material (e.g., rubber). In at least some embodiments, the biasing members 304A, 304B and the stoppers 306A, 306B are composed of or are at least coated with an insulating material, such as rubber.

In at least some embodiments, the stoppers 306A, 306B have a height (e.g., 50 um) that is less than the uncompressed height of pins 308 (e.g., 100 um), although the pins 308 may be compressed to any suitable height (e.g., 25 um at maximal compression). In at least some embodiments, the biasing members 304A, 304B in their uncompressed states have heights (e.g., 150 um) greater than those of the uncompressed pins 308 and the stoppers 306A, 306B. In at least some embodiments, the biasing members 304A, 304B in their maximally compressed states have heights (e.g., 25 um) that are less than or equal to those of the uncompressed pins 308 and/or the stoppers 306A, 306B.

Figure 3B:
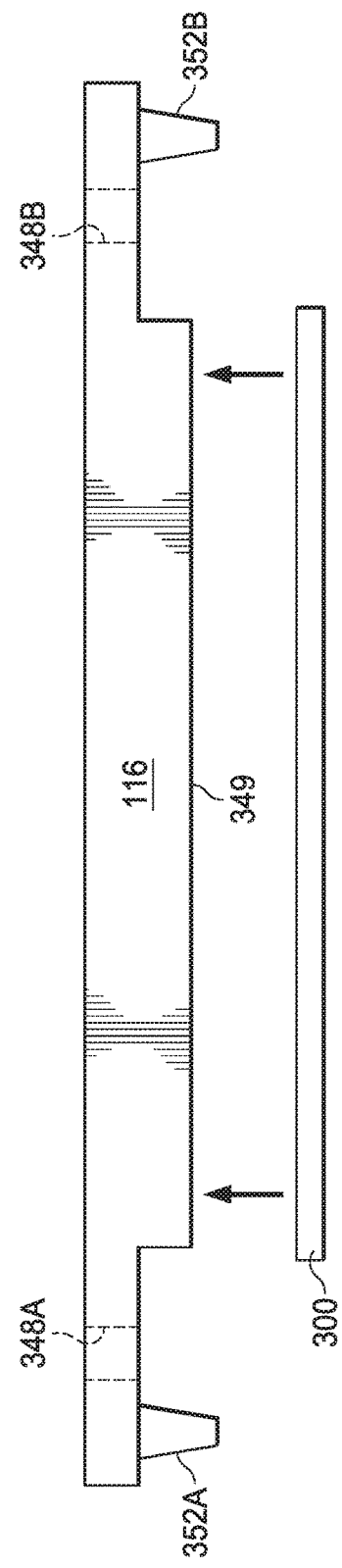
FIG. 3B is a side view of an illustrative semiconductor test wafer engagement plate on which an illustrative test wafer is to be mounted, in accordance with various embodiments.

FIG. 3B is a side view of an illustrative semiconductor test wafer engagement plate (TWEP) 116 on which the illustrative test wafer 300 is to be mounted, in accordance with various embodiments. In some embodiments, the TWEP 116 comprises alignment features 352A, 352B that are configured to mate with the alignment features 302A, 302B on TWAP 114 and the sizes and shapes of which are determined based on the corresponding alignment features 302A, 302B. Thus, FIG. 3B depicts alignment features 352A, 352B that are configured to mate with the alignment features 302A, 302B depicted in FIG. 3A, but other types of alignment features 352A, 352B are contemplated and fall within the scope of this disclosure. The TWEP 116 further includes fastening features 348A, 348B. In some embodiments, the fastening features 348A, 348B are threaded orifices configured to receive screws (e.g., thumb screws), although the scope of this disclosure is not limited as such. The TWEP 116 additionally may include a protrusion 349 on which a test wafer, such as the test wafer 300, may be mounted (e.g., using any suitable technique, such as glue, solder, or screws). In some embodiments, an insulating pad (not expressly shown) may be positioned between the test wafer 300 and the TWEP 116. The test wafer 300 is mounted on the TWEP 116 such that the side of the wafer 300 on which ICs are formed faces away from the TWEP 116. The thickness of the protrusion 349 depends at least in part on the depth of the recessed area 310 (FIG. 3A) relative to the plane with which the apertures of the fastening features 303A, 303B are coincident.

Figure 3C:
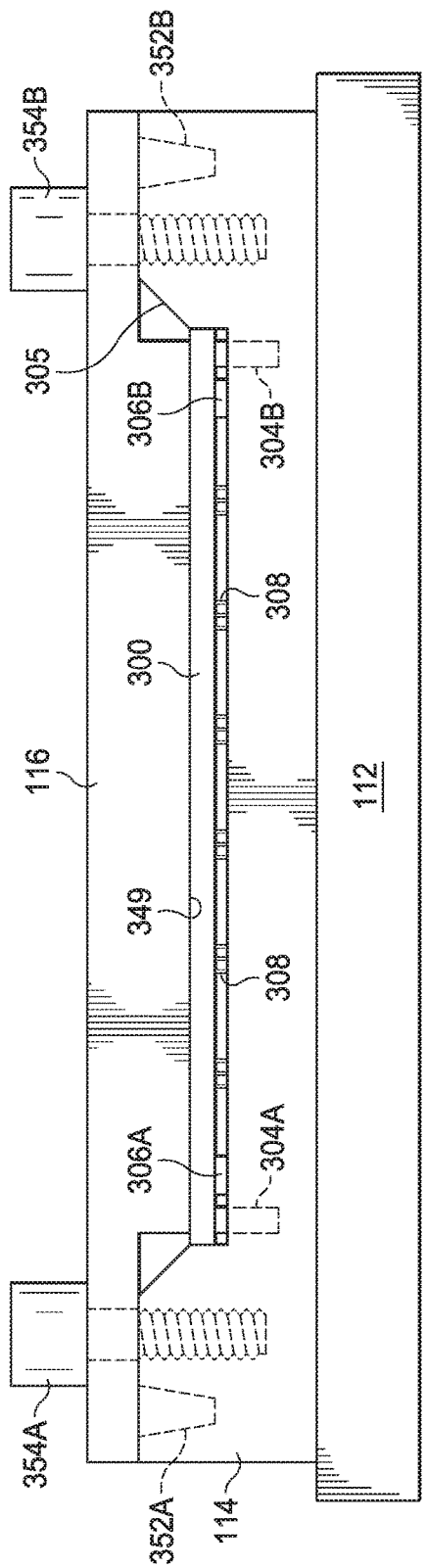
FIG. 3C is a side view of an illustrative semiconductor test wafer alignment plate fastened to an illustrative semiconductor test wafer engagement plate with an illustrative test wafer positioned between the plates, in accordance with various embodiments.

FIG. 3C is a side view of an illustrative TWEP 116 fastened to an illustrative TWAP 114 with an illustrative test wafer 300 positioned between the plates, in accordance with various embodiments. In particular, the TWEP 116, with the test wafer 300 having been mounted thereupon, is positioned on the TWAP 114 in the manner that FIG. 3C depicts, with the test wafer 300 facing the pins 308. The desired alignment between the test wafer 300 and the pins 308 is achieved due to the mating of the alignment features 302A, 302B, 352A, and 352B. When the TWEP 116 is placed against the TWAP 114, the biasing members 304A, 304B hold the test wafer 300 away from the pins 308. Fastening members 354A, 354B (e.g., thumb screws) are then inserted into the fastening features in the plates 116 and 114. As the fastening members 354A, 354B are tightened (e.g., at the same or similar rates), the TWEP 116 is more tightly fastened to the TWAP 114, and the biasing members 304A, 304B and pins 308 are compressed. Such compression continues with fastening of the members 354A, 354B until the test wafer 300 contacts the stoppers 306A, 306B. At this point, further fastening of the members 354A, 354B produces no additional downward movement of the TWEP 116 and the test wafer 300, due to the stoppers 306A, 306B. The alignment features 302A, 302B, 352A, and 352B, the biasing members 304A, 304B, the stoppers 306A, 306B, the fastening features 303A, 303B, 348A, and 348B, and the fastening members 354A, 354B operate in concert to achieve a target alignment and contact pressure between the test wafer 300 ICs and the pins 308, as well as a target compression of the pins 308. Other fastening mechanisms may be used in lieu of the fastening members 354A, 354B to facilitate the even, simultaneous compression of the pins 308.

Figure 3D:
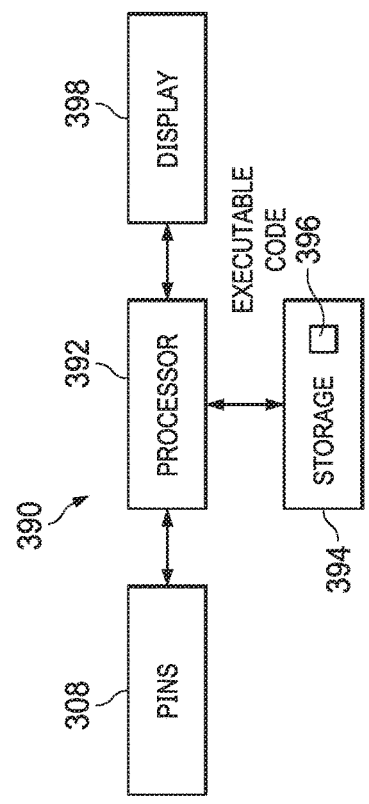
FIG. 3D is a block diagram of an illustrative testing computer to provide, receive, and analyze electrical signals to detect the presence of defective components in a wafer testing system, in accordance with various embodiments.

Once the target alignment and contact pressure between the test wafer 300 ICs and the pins 308 have been achieved, electrical signals may be provided to and received from the ICs via the pins 308 to test the ICs. Referring to FIG. 3D, the pins 308 may indirectly couple to a testing computer 390 that comprises, e.g., a processor 392 and a non-transitory computer-readable medium 394 storing executable code 396 that is executable by the processor 392 to provide the electrical signals to the pins 308, receive electrical signals from the pins 308, and process the electrical signals to identify irregularities in the received signals suggesting that one or more components in the system 100 is defective. Suitable warnings may be displayed to a user on a display 398.

Figure 4A:
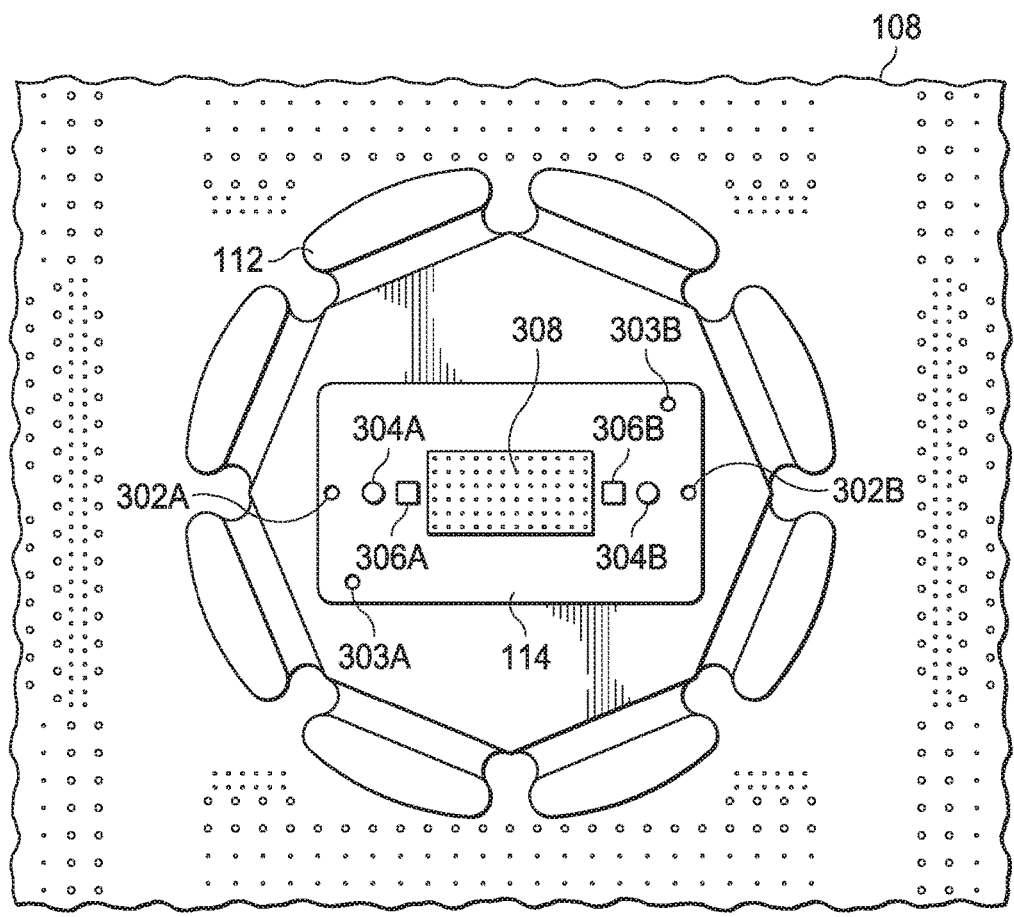
FIG. 4A is a top-down view of an illustrative semiconductor test wafer alignment plate mounted on a probe head which, in turn, is mounted on a probe card, in accordance with various embodiments.

FIG. 4A is a top-down view of an illustrative TWAP 114 mounted on a probe head 112 which, in turn, is mounted on a probe card 108, in accordance with various embodiments. As shown, the TWAP 114 includes the above-described alignment features 302A and 302B, fastening features 303A and 303B, biasing members 304A and 304B, stoppers 306A and 306B, and pins 308. The arrangement of these features on the TWAP 114 as depicted in FIG. 4A is illustrative and non-limiting. Other arrangements are contemplated. For example, in some embodiments, different features may be positioned closer to or farther from the pins 308 than they are in FIG. 4A. In some embodiments, different features may be positioned closer to or farther from different sides of the perimeter of the TWAP 114 than they are in FIG. 4A. In some embodiments, certain features may be fewer or greater in number than they are in FIG. 4A.

Figure 4B:
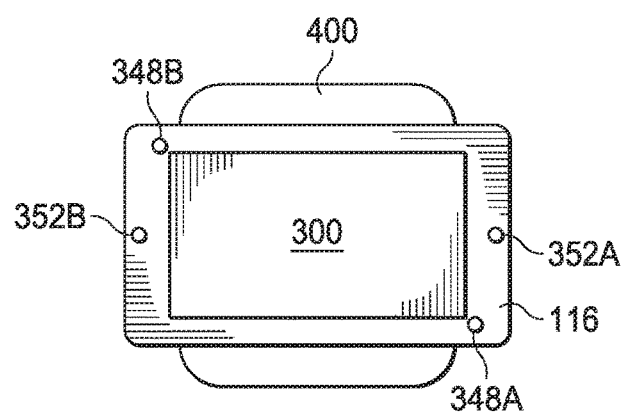
FIG. 4B is a bottom-up view of a test wafer mounted on a semiconductor test wafer engagement plate, in accordance with various embodiments.

FIG. 4B is a bottom-up view of an illustrative test wafer 300 mounted on an illustrative TWEP 116, in accordance with various embodiments. As shown, the TWEP 116 comprises alignment features 352A and 352B and fastening features 348A and 348B. These features are positioned on the TWEP 116 such that when the TWEP 116 is fastened to the TWAP 114, the features align with their corresponding features on the TWAP 114. For example, the alignment feature 352A would align with alignment feature 302A, as FIG. 3C depicts. Similarly, the alignment feature 352B would align with alignment feature 302B. Likewise, fastening features 348A and 303A would align to permit fastening member 354A to pass therethrough, and fastening features 348B and 303B would align to permit fastening member 354B to pass therethrough. A handle 400 may be provided with which to manually grip the TWEP 116.

Figure 4C:
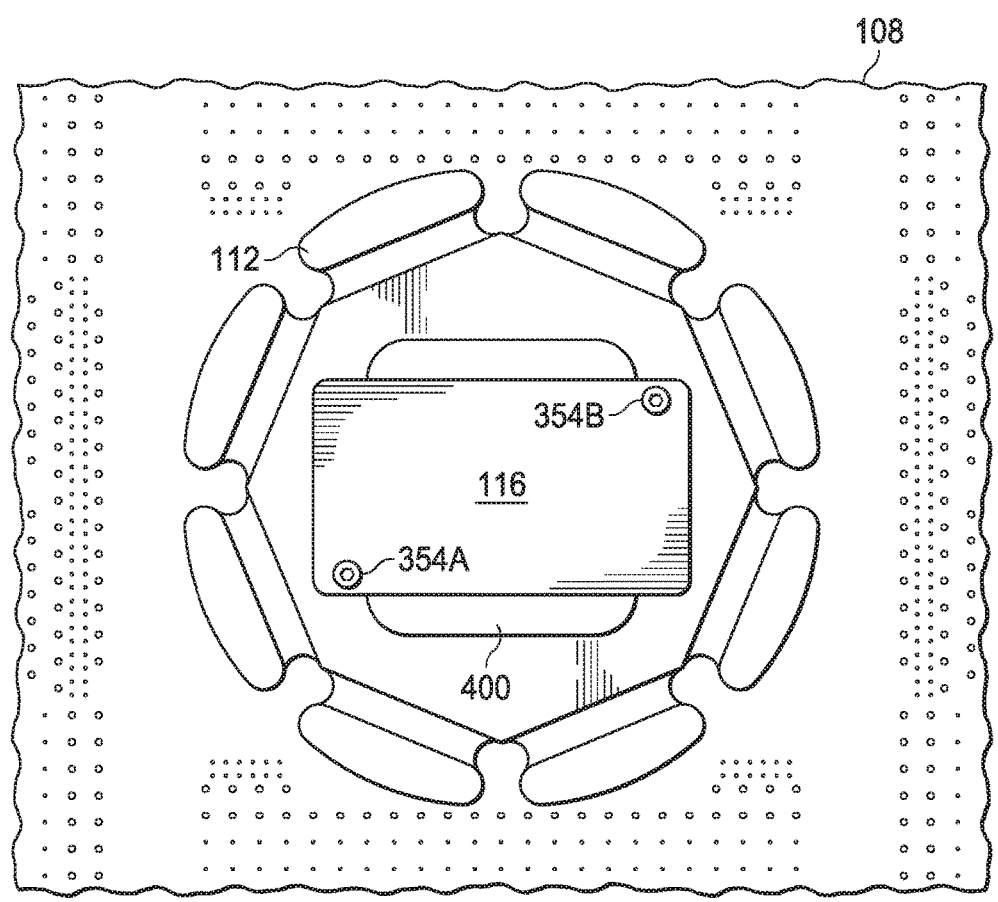
FIG. 4C is a top-down view of an illustrative semiconductor test wafer engagement plate fastened to an illustrative semiconductor test wafer alignment plate, in accordance with various embodiments.

FIG. 4C is a top-down view of an illustrative TWEP 116 fastened to an illustrative TWAP 114 (not visible in FIG. 4C) using fastening members 354A and 354B, in accordance with various embodiments.

Figure 5:
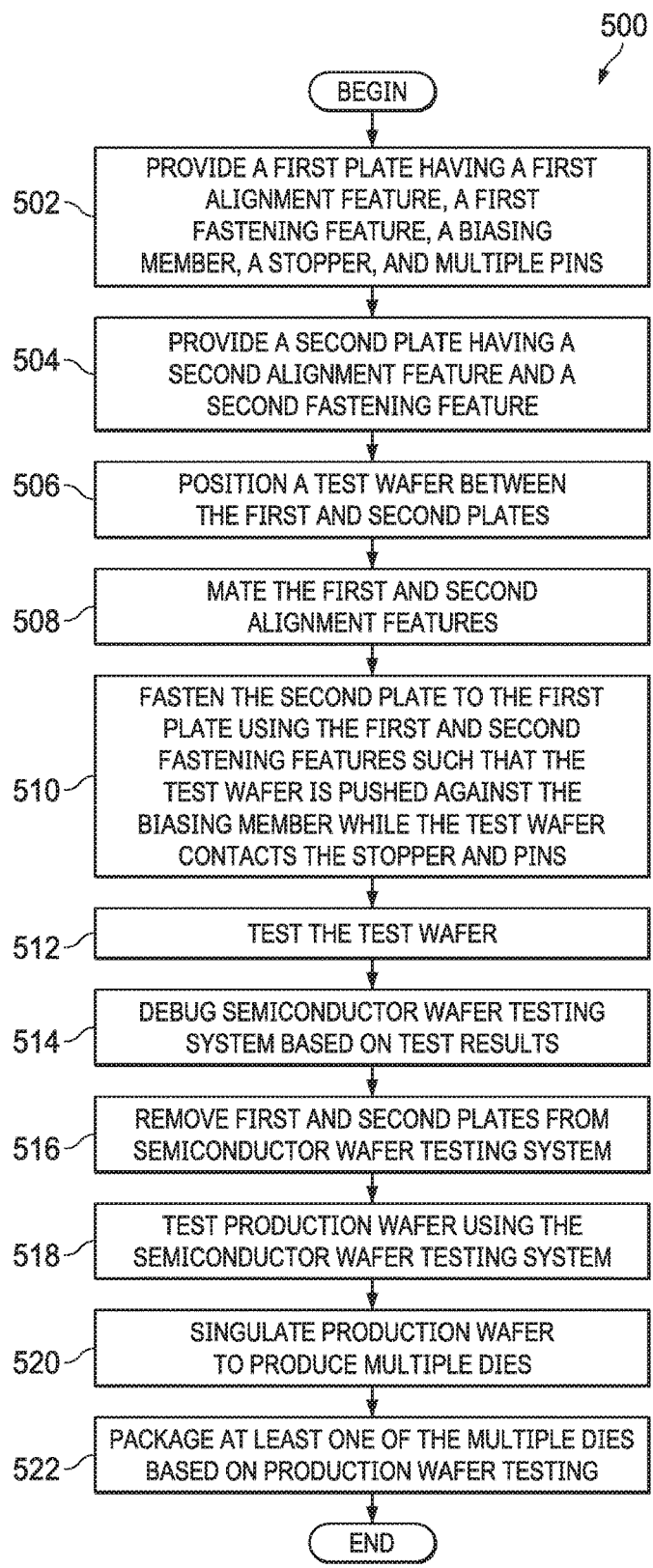
FIG. 5 is a flow diagram of a method for fastening a semiconductor test wafer engagement plate having a test wafer mounted thereupon to a semiconductor test wafer alignment plate, in accordance with various embodiments.

FIG. 5 is a flow diagram of an illustrative method 500 for fastening a semiconductor test wafer engagement plate to a semiconductor test wafer alignment plate having a test wafer mounted thereupon (e.g., as FIGS. 3C and 4C depict). The method 500 begins by providing a first plate having a first alignment feature, a first fastening feature, a biasing member, a stopper, and multiple pins (step 502). FIGS. 3A and 4A depict such a first plate. The method 500 next includes providing a second plate having a second alignment feature and a second fastening feature (step 504). FIGS. 3B and 4B depict such a second plate. The method 500 then comprises positioning a test wafer between the first and second plates (step 506) and engaging the first and second alignment features (step 508). The method 500 additionally includes fastening the second plate to the first plate using the first and second fastening features such that the test wafer is pushed against the biasing member while the test wafer (i.e., ICs that are formed on and thus are part of the test wafer) contacts the stopper and pins (step 510). FIGS. 3C and 4C depict the performance of steps 506, 508, and 510.

The method 500 further comprises testing the test wafer using the first and second plates (step 512). For example, a testing computer (e.g., the testing computer 390 of FIG. 3D) may provide signals to and receive signals from the test wafer via the pins on the first plate while the second plate facilitates a secure positioning of the test wafer relative to the first plate. The testing computer may compare the received signals to signals that were expected based on the known electrical characteristics of the test wafer and the computer may output information (e.g., on a display) regarding the presence of one or more component defects in the wafer testing system. In response to the output information, a user may debug the wafer testing system (step 514). In particular, the user may directly access one or more components (e.g., pins) in the wafer testing system to diagnose and correct the defective component(s). For example, the user may directly access pins or a probe card to run diagnostic tests. In this manner, the user may identify and repair the defective component(s) without the use of a wafer probe cell.

The method 500 then includes removing the first and second plates from the wafer testing system (step 516) and testing a production wafer using the wafer testing system (step 518). After removal of the plates and prior to testing the production wafer, the wafer testing system may be modified as necessary to accommodate production wafers—for instance, by switching the probe head 112 with a different probe head. In some cases, however, such modifications may be unnecessary. The results of the production wafer testing may indicate which circuits formed on the wafer meet required testing benchmarks and which do not. Such results may take the form of a wafer map, for example. The method 500 then comprises singulating the production wafer to produce multiple dies (step 520) and packaging at least one of the multiple dies based on the production wafer testing results (step 522). In embodiments, only those dies containing circuitry that met the required testing benchmarks are packaged, and the remaining dies are discarded. The steps of the method 500 may be modified as desired, including by adding, deleting, modifying, or rearranging one or more steps.

The above discussion is meant to be illustrative of the principles and various embodiments disclosed herein. Numerous variations and modifications will become apparent to those skilled in the art once the above disclosure is fully appreciated. It is intended that the following claims be interpreted to embrace all such variations and modifications.

The following is claimed:

1. A semiconductor wafer testing system, comprising:
a first plate configured to couple to a probe head, the first plate including a first alignment feature, a biasing member, a stopper, and pins; and
a second plate configured to fasten to the first plate and including a second alignment feature configured to engage with the first alignment feature,
wherein the first and second alignment features are configured to align the pins with a test wafer positioned between the first and second plates, and wherein the biasing member and the stopper are configured to cooperate to regulate a pressure with which the test wafer contacts the pins when the second plate is fastened to the first plate.

2. The system of claim 1, wherein the second plate is configured to attach to the test wafer.

3. The system of claim 1, wherein the pins include compressible pins.

4. The system of claim 1, wherein the biasing member is positioned on the first plate such that the biasing member has an uncompressed height that is greater than a height of the stopper.

5. The system of claim 1, wherein the second plate includes a thumb screw to fasten to the first plate.

6. The system of claim 1, wherein the test wafer is rectangular.

7. The system of claim 1, further comprising a testing computer to provide an electrical signal to the test wafer, to receive a response signal from the test wafer, and to indicate a defect in at least one component of the system based on the received response signal.

8. A semiconductor test wafer alignment plate (TWAP), comprising:
first alignment features to engage with second alignment features on a semiconductor test wafer engagement plate (TWEP);
multiple fastening features to couple the TWAP to the TWEP;
multiple biasing members to resist a test wafer pressed toward the biasing members by the TWEP;
multiple stoppers to resist the test wafer pressed toward the stopper by the TWEP; and
multiple pins to contact integrated circuits on the wafer, wherein the multiple pins are to provide electrical signals to and receive electrical signals from integrated circuits on the test wafer.

9. The TWAP of claim 8, wherein each of the multiple biasing members, when uncompressed, has a height that is greater than that of each of the multiple stoppers.

10. The TWAP of claim 8, wherein the multiple pins are arranged in a rectangular pattern on the TWAP.

11. The TWAP of claim 8, wherein the multiple fastening features comprise threaded orifices to receive thumb screws.

12. The TWAP of claim 8, wherein each of the first alignment features, each of the multiple fastening features, each of the multiple biasing members, and each of the multiple stoppers is located closer to a perimeter of the TWAP than each of the multiple pins.

13. A method, comprising:
providing a first plate having a first alignment feature, a first fastening feature, a biasing member, a stopper, and a plurality of pins;
providing a second plate having a second alignment feature and a second fastening feature;
positioning a test wafer between the first and second plates;
engaging the first and second alignment features; and
fastening the second plate to the first plate using the first and second fastening features,
wherein the fastening comprises pushing the test wafer against the biasing member such that the test wafer contacts the stopper and the plurality of pins.

14. The method of claim 13, wherein the first and second plates are part of a semiconductor wafer testing system, and further comprising:
testing the test wafer using the first and second plates;
debugging the semiconductor wafer testing system based on results of the test wafer testing;
removing the first and second plates from the semiconductor wafer testing system;
testing a production wafer using the semiconductor wafer testing system; and
singulating the production wafer to produce a plurality of dies.

15. The method of claim 14, further comprising packaging at least one of the plurality of dies based at least in part on results of the production wafer testing.

16. The method of claim 13, wherein the test wafer comprises an integrated circuit, and wherein the fastening includes urging the integrated circuit to contact the plurality of pins.

17. The method of claim 13, further comprising attaching the test wafer to the second plate prior to fastening the second plate to the first plate.

18. The method of claim 13, wherein the first fastening feature includes a threaded orifice and wherein the second fastening feature includes a thumb screw.

19. The method of claim 13, further comprising:
applying electrical signals to the test wafer via the plurality of pins;
receiving one or more signals from the test wafer in response to the application;
determining that a defect is present in at least one of the plurality of pins in response to the receipt; and
accessing the defective at least one of the plurality of pins to correct the defect.

20. The method of claim 13, further comprising identifying a defect in at least one of the plurality of pins using the test wafer and without using a wafer probe cell.

* * * * *